US011867843B2

United States Patent
Hostetler et al.

(10) Patent No.: US 11,867,843 B2
(45) Date of Patent: *Jan. 9, 2024

(54) REAL TIME NOISE DETECTION METHOD AND SYSTEM FOR PHOTON COUNTING PIXEL ARRAY COMPRISING A MASK MATERIAL TO YIELD BLOCKED PIXELS FROM DETECTING REFLECTED PULSES OF ENERGY

(71) Applicant: LG INNOTEK CO., LTD., Seoul (KR)

(72) Inventors: John Hostetler, Hightstown, NJ (US); Yahla Tachwali, Princeton, NJ (US)

(73) Assignee: LG INNOTEK CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/929,767

(22) Filed: Sep. 6, 2022

(65) Prior Publication Data

US 2023/0003859 A1 Jan. 5, 2023

Related U.S. Application Data

(63) Continuation of application No. 17/062,856, filed on Oct. 5, 2020, now Pat. No. 11,486,987.

(51) Int. Cl.
*G01S 7/491* (2020.01)
*G01S 7/4912* (2020.01)
*G01S 7/481* (2006.01)
*G01S 17/931* (2020.01)
*H01L 27/144* (2006.01)

(52) U.S. Cl.
CPC ......... *G01S 7/4912* (2013.01); *G01S 7/4816* (2013.01); *G01S 17/931* (2020.01); *H01L 27/1443* (2013.01); *H01L 27/1446* (2013.01)

(58) Field of Classification Search
CPC .......... G01S 17/02; G01S 17/04; G01S 17/06; G01S 17/88; G01S 17/93; G01S 19/00; G01S 7/48; G01S 7/491; H01L 27/144; H01L 27/146
USPC ................... 250/214.1, 239, 208.1
See application file for complete search history.

(56) References Cited

U.S. PATENT DOCUMENTS

| | | | |
|---|---|---|---|
| 8,476,594 B2 * | 7/2013 | Frach | G01T 1/2985 250/363.04 |
| 10,650,531 B2 | 5/2020 | Lakshmi Narayanan et al. | |
| 2013/0300838 A1 | 11/2013 | Borowski | |

(Continued)

OTHER PUBLICATIONS

Isenburg, M., "Removing Noise from Single Photon LiDAR to Generate a Smooth DTM", rapidlasso GmbH, Dec. 16, 2019.

*Primary Examiner* — Que Tan Le
(74) *Attorney, Agent, or Firm* — Birch, Stewart, Kolasch & Birch, LLP (57) ABSTRACT

A single photon counting sensor array includes one or more emitters configured to emit a plurality of pulses of energy, and a detector array comprising a plurality of pixels. Each pixel includes one or more detectors, a plurality of which are configured to receive reflected pulses of energy that were emitted by the one or more emitters. A mask material is positioned to cover some but not all of the detectors of the plurality of pixels to yield blocked pixels and unblocked pixels so that each blocked pixel is prevented from detecting the reflected pulses of energy and therefore only detects intrinsic noise.

20 Claims, 8 Drawing Sheets

(56) References Cited

U.S. PATENT DOCUMENTS

| | | |
|---|---|---|
| 2019/0146070 A1 | 5/2019 | Hansson |
| 2020/0116560 A1 | 4/2020 | Pacala et al. |
| 2020/0249349 A1 | 8/2020 | Steinberg |
| 2020/0256960 A1 | 8/2020 | LaChapelle et al. |

\* cited by examiner

REAL TIME NOISE DETECTION METHOD AND SYSTEM FOR PHOTON COUNTING PIXEL ARRAY COMPRISING A MASK MATERIAL TO YIELD BLOCKED PIXELS FROM DETECTING REFLECTED PULSES OF ENERGY

RELATED APPLICATIONS AND CLAIM OF PRIORITY

This patent document claims priority to, and is a continuation of, U.S. patent application Ser. No. 17/062,856, filed Oct. 5, 2020, the disclosure of which is fully incorporated into this document by reference.

BACKGROUND

Recently, increased development of autonomy in transportation including both fully autonomous vehicles (AVs) and advanced driver assistance systems (ADAS) has led to an increased demand for high speed three-dimensional (3D) imaging technologies that can detect the location and details of objects in a highly dynamic environment. Light detection and ranging (LiDAR) systems have become an extremely important imaging technology for autonomous vehicle applications as it offers the highest range and resolution for 3D imaging compared to other methods, e.g. radar and ultrasonics. A LiDAR system is a sensor that emits light directed at the surrounding environment, and detects the reflected light off of objects such as landscape, pedestrians, structures and vehicles (i.e., moving actors or stationary objects).

One method of determining the location of such objects is by time-of-flight (TOF) where light pulses are emitted from the sensor and the distance to the target is determined by the round trip time of the reflected pulse, since the speed of light is constant. This time based data is collected and used to generate a LiDAR spatial point cloud, which is a three-dimensional (3D) representation of the surrounding environment in space, depicted as discrete points along the vertical, horizontal and longitudinal axes. For each point generated in the point cloud, a histogram of data is collected where the detector samples all responses occurring during the time after which the pulse is emitted until the time that corresponds to the maximum measurable distance set by the system parameters. The histogram is formed by sampling the return pulse intensity and recording the time the reflected pulses arrived back at the detector.

The job of the LiDAR system analyzer is to survey the time based histogram and discern which intensity peaks are from real targets, i.e. the signal, and which are from noise sources. Not all light received by LiDAR systems is reflected light that the LiDAR system originally generated. A wide variety of noise sources can interfere with the LiDAR system which includes external noise sources, such as solar background and other light sources, as well as intrinsic noise generated within the LiDAR system itself. Intrinsic noise generally includes any signal (avalanche counts) not caused by the direct photon reception. Example types of intrinsic noise include dark count noise and cross talk.

More recently, improvements in LiDAR systems that utilize avalanche photodiodes in Geiger-mode (GmAPD) allow for single photon counting and can provide increased sensitivity for light detection compared to traditional LiDAR systems utilizing linear mode avalanche photodiodes (APDs) which require multi-photons for a measurable response. Accurate noise characterization is even more critical in LiDAR systems that use Geiger-mode photodiode detectors, as the higher sensitivity inherently comes with higher noise components from the surrounding environment and from the system itself. Accurate determination of the noise components in the time-based intensity histogram is critical to achieving a high signal-to-noise ratio, or alternatively tolerating a lower signal-to-noise ratio, and accurately creating a 3D point cloud in the space that surrounds the lidar system. For the case of autonomous vehicles, this noise characterization must be analyzed in a high speed manner as the LiDAR system is moving in a highly dynamic and ever-changing environment.

The intrinsic noise of Geiger-mode detectors include noise sources such as dark count rate, afterpulses and early fires, which can occur from within individual detectors. Furthermore, as Geiger-mode LiDAR systems are deployed with a high density array of tightly pitched pixels for better spatial resolution, the characterization of intrinsic noise interference between neighboring pixels, i.e. crosstalk, is even more critical for correctly analyzing and realizing a higher signal-to-noise ratio for longer range detection with higher spatial resolution.

This document describes methods and systems that are directed to addressing the realtime in situ characterization of intrinsic noise sources of Geiger-mode avalanche photodiode pixels arranged in a high density pixel array, and/or other issues related thereto.

SUMMARY

A single photon counting sensor array includes one or more emitters configured to emit a plurality of pulses of energy, and a detector array comprising a plurality of pixels. Each pixel includes one or more detectors, a plurality of which are configured to receive reflected pulses of energy that were emitted by the one or more emitters. A mask material is positioned to cover some but not all of the detectors of the plurality of pixels to yield blocked pixels and unblocked pixels so that each blocked pixel is prevented from detecting the reflected pulses of energy.

A system that is operable with the sensor array includes a processor and programming instructions to receive characteristic data of signals received by the blocked pixels and the unblocked pixels, and to compare the characteristic data of the signals received by the blocked pixels with the characteristic data of the signals received by the unblocked pixels to determine a measurement of intrinsic noise in the detector array.

In various embodiments, the single photon counting sensor array may be an element of a light detection and ranging (LiDAR) system in systems in which the distance between centerpoints of adjacent pixels in the detector array is less than the crosstalk length.

In various embodiments, each detector may include a photosensor that has a surface region of p-type semiconductor material that is positioned to receive light, a drift region of n-type semiconductor material, and a conductive trace that is connected to the surface region and positioned to serve as an anode for the photosensor. The detector array may include a substrate on which the photosensors are positioned. The substrate may be configured to function as a cathode for each of the photosensors. Each blocked pixel may have the mask material positioned over its surface region to block light from entering the blocked pixel.

In various embodiments, the detector array may include a substrate that is configured to function as a cathode for each of the photosensors. Each of the photosensors may include a metal window that extends through the substrate and that is configured to receive light into the photosensor. A region of n-type semiconductor material may be connected to the metal window of each photosensor. A region of p-type semiconductor material may be connected to the region of n-type semiconductor material of each photosensor. A conductive trace may be connected to the region of p-type semiconductor material of each photosensor and positioned to serve as an anode for the photosensor. The mask material may be positioned to cover the metal window of each blocked pixel.

In various embodiments, when comparing the characteristic data of the signals received by the blocked pixels with the characteristic data of the signals received by the unblocked pixels to determine a measurement of intrinsic noise in the detector array, the system may: (i) identify a superpixel comprising a group of the pixels in the detector array; (ii) determine a total photon count rate received by the superpixel; (iii) determine an avalanche count rate received by the unblocked pixels of the superpixel; and (iv) determine the measurement of noise as a function of the total photon count rate and the avalanche count rate received by the unblocked pixels of the superpixel. Optionally, the function may be:

$$\lambda = \Sigma_{i=1}^{N} \lambda_i : \lambda_i = \beta \lambda_S^{(i)} + \beta \lambda_{bk}^{(i)} + \lambda_n^{(i)}$$

in which:

$\lambda$=avalanche count rate as received by of the superpixel;

$\lambda_S^{(i)}$=a photon count rate resulting from reflected signal photons at photosensor i;

$\lambda_{bk}^{(i)}$=a photon count rate resulting from background signal photons (i.e., at detector i;

$\lambda_n^{(i)}$=avalanche count rate of intrinsic noise of detector i; and $\beta$=photon detection efficiency.

In various embodiments, the system may include a data recorder that is configured to receive the signals from the pixels and store the characteristic data corresponding to the received signals.

Optionally, the mask material may be formed of metal.

In various embodiments, the system may be configured to measure health of the detector array by monitoring spatial variation, temporal variation, or both spatial variation and temporal variation of measured noise from blocked detectors. In addition or alternatively, the system may be configured to apply a characterization function to estimate, in an intensity estimation, an amount of measurement bias caused by crosstalk.

DETAILED DESCRIPTION

As used in this document, the singular forms "a," "an," and "the" include plural references unless the context clearly dictates otherwise. Unless defined otherwise, all technical and scientific terms used in this document have the same meanings as commonly understood by one of ordinary skill in the art. As used in this document, the term "comprising" means "including, but not limited to." Definitions for additional terms that are relevant to this document are included at the end of this Detailed Description.

Figure 1:
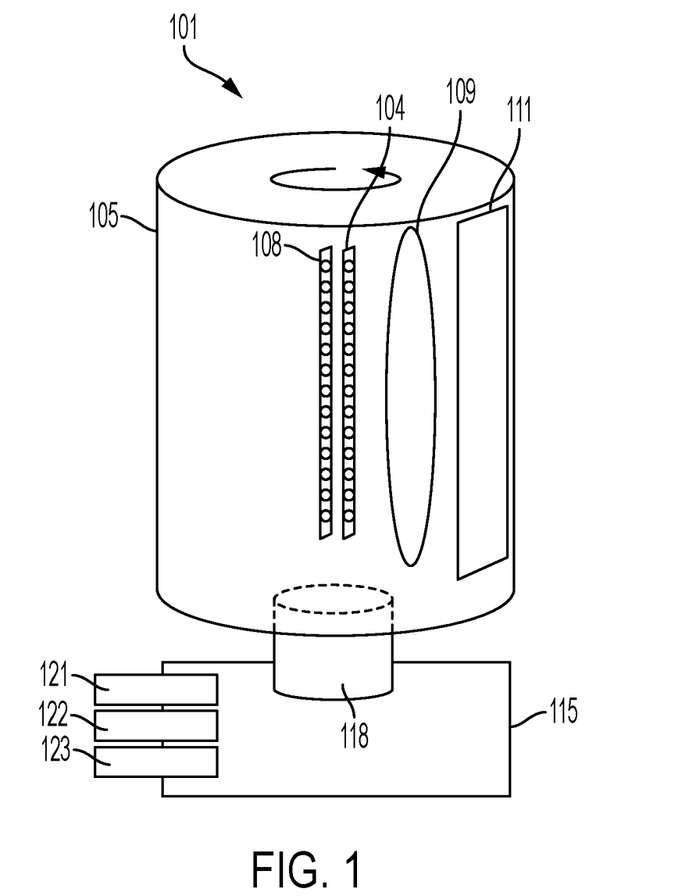
FIG. 1 illustrates example components of a LiDAR system.

FIG. 1 shows an example LiDAR system 101 as may be used in various embodiments. As shown in FIG. 1, the LiDAR system 101 includes a housing 105 which may be rotatable 360° about a central axis such as hub or axle 118. The housing may include an emitter/receiver aperture 111 made of a material transparent to light. Although the example shown in FIG. 1 has a single aperture, in various embodiments, multiple apertures for emitting and/or receiving light may be provided. Either way, the system can emit light through one or more of the aperture(s) 111 and receive reflected light back toward one or more of the aperture(s) 111 as the housing 105 rotates. In an alternative embodiment, the outer shell of housing 105 may be a stationary dome, at least partially made of a material that is transparent to light, with rotatable components inside of the housing 105.

Inside the rotating shell or stationary dome is a light emitter system 104 that is configured and positioned to generate and emit pulses of light through the aperture 111 or through the transparent dome of the housing 105 via one or more laser emitter chips, an array of emitters on one chip, or other light emitting devices. The emitter system 104 may include any number of individual emitters, including for example but not limited to 8 emitters, 64 emitters or 128 emitters. The emitters may emit light of substantially the same intensity, or of varying intensities. The LiDAR system will also include a light detector 108 containing a photodetector or array of photodetectors positioned and configured to receive light reflected back into the system. The emitter system 104 and detector 108 would rotate with the rotating shell, or they would rotate inside the stationary dome of the housing 105. One or more optical element structures 109 may be positioned in front of the light emitting unit 104 and/or the detector 108 to serve as one or more lenses or waveplates that focus and direct light that is passed through the optical element structure 109.

The LiDAR system will include a power unit 121 to power the laser emitter unit 104, a motor, and electronic components. The LiDAR system will also include an analyzer 115 with elements such as a processor 122 and non-transitory computer-readable memory 123 containing programming instructions that are configured to enable the system to receive data collected by the light detector unit, analyze it to measure characteristics of the light received, and generate information that a connected system can use to make decisions about operating in an environment from which the data was collected. Optionally, the analyzer 115 may be integral with the LiDAR system 101 as shown, or some or all of it may be external to the LiDAR system and communicatively connected to the LiDAR system via a wired or wireless communication network or link.

This document describes a noise compensation method and system that may be used with single photon counting pixel arrays. Single photon counting pixel arrays may be used in LiDAR systems such as those described above, and especially in LiDAR systems that use GmAPDs as sensors. However, the methods and systems described below are not limited to LiDAR systems and also may be used in X-ray detectors and other sensing systems that use single photon counting pixel arrays and other types of pixel arrays as detectors.

As noted in the Background section above, intrinsic noise generated within a LiDAR system can cause counts that do not originate from a reflected light pulse off of an intended target. Intrinsic noise can be caused by a variety of factors, including material quality and cross talk between pixels. Intrinsic noise can also vary with temperature, humidity, or other environmental conditions of the area in which the system is being used. Accurate, real-time characterization of noise can help separate true signal count rates from noise count rates, and thus improve performance of the system.

For example, the dark count rate (DCR) of a Geiger-mode detection system is the average rate of registered counts, i.e., avalanche events, without any incident light on the pixels, and thus represents an intrinsic noise component. The DCR of a detection system is a function of the applied bias on the device where at higher applied bias over a breakdown voltage, (Vbr), the higher the DCR. In addition, for an array of isolated pixels that extend over an appreciable spatial region, variations in Vbr and DCR can exist and thus create a variation in noise across the pixel array. The sensitivity of a single photon detector is a function of its pixels' DCR, as this dictates how much "overbias" can be applied to a detector and still maintain a usable signal-to-noise ratio.

The methods below provide a method to detect, and optionally to compensate, for the intrinsic noise in an isolated pixel in real time. In this way, the sensitivity of the system can be improved without further increasing the bias, or by increasing the signal-to-noise ratio at higher bias, thereby improving performance.

Figure 2:
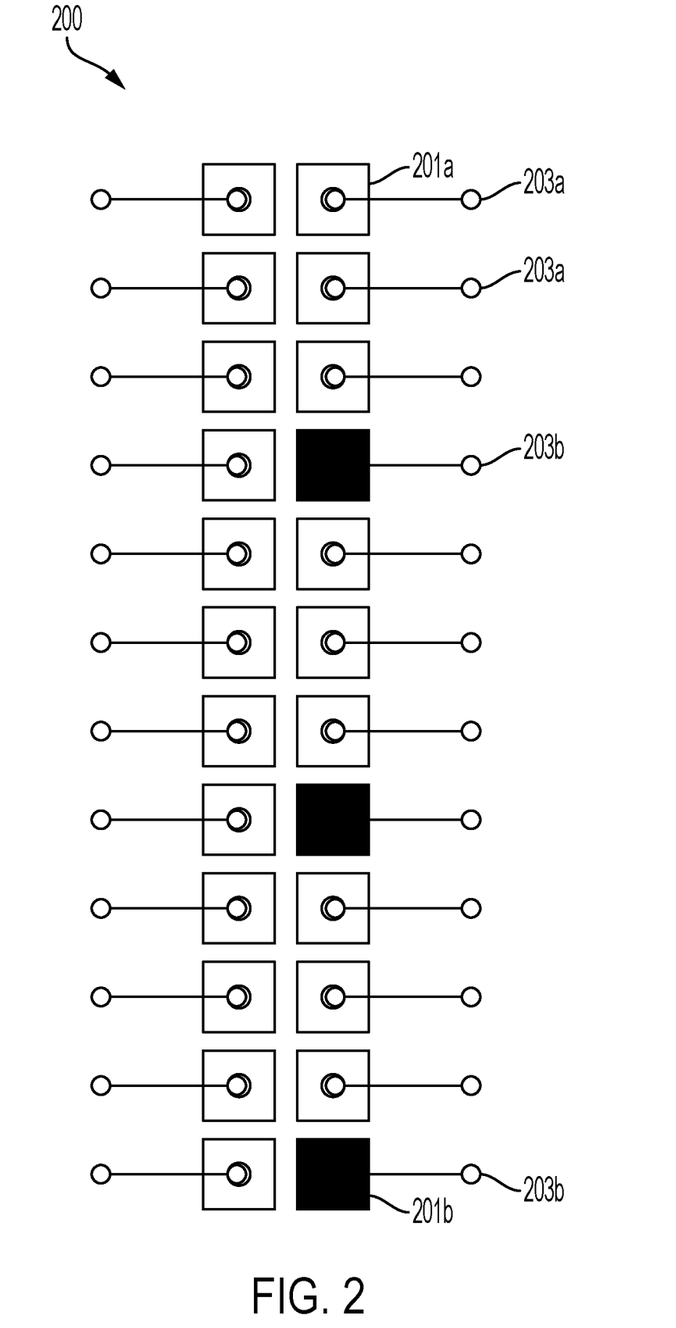
FIG. 2 is an example detector array for a LiDAR system in which light is received via a front (anode) side of the detector array.

FIG. 2 is a front side view of an example front side detector array 200 that includes N×2 pixels for a LiDAR system. (In this context, the "front" side is the side of the detector array 200 that includes the anode. In this embodiment, the anode is positioned to face outward from the LiDAR system so that it receives the reflected light.) Each pixel 201 includes an active area that serves as a photodetector, and each pixel is connected to an anode contact via a conductive (typically metal) trace 203. Most of the pixels will be unmasked, meaning that their photodetectors are exposed and receive reflected energy as would be expected in such an array. However, a subset of the pixels and their conductive traces will be covered by a mask that blocks the photodetectors from receiving reflected energy. (FIG. 2 designates a few example unmasked pixels as 201a and masked pixels (which also be referred to as blocked pixels) as 201b. It also designates example unmasked traces as 203a and masked traces as 203b.) The masks may be formed of metal such as typical metal stacks such as Ti/Pt/Au, Ni, Cr, W, or any material that effectively blocks light having a wavelength of interest from passing through it. In a LiDAR system, the wavelengths of interest may be those in the ultraviolet (UV) region (i.e., 180-480 nm), and optionally those in the visible region (i.e., 400-700 nm) and optionally those in the near infrared (IR) region (i.e. 700-2000 nm). The spatial distribution of blocked detectors shown in FIG. 2 is only an example; other arrangements are possible.

Each mask will cover the entire active (photosensitive) area of the pixel, and each mask may be formed during the wafer manufacturing process. The mask may also be formed at the same times as the metal traces. The masks may be applied at various locations in the array in any arrangement, such as every nth pixel in a row or column, or even in a random arrangement.

In the arrangement shown in FIG. 2, masked pixels will be biased equally to their neighboring pixels, but will be unable to receive direct optical input from outside light. Accordingly, any counts generated by any masked pixel must only come from intrinsic noise such as material defects and crosstalk from neighboring pixels. This noise measurement for any active pixel can be used to adjust the values of signals received by neighboring pixels, or values of all signals received, to provide real time noise suppression.

Figure 3:
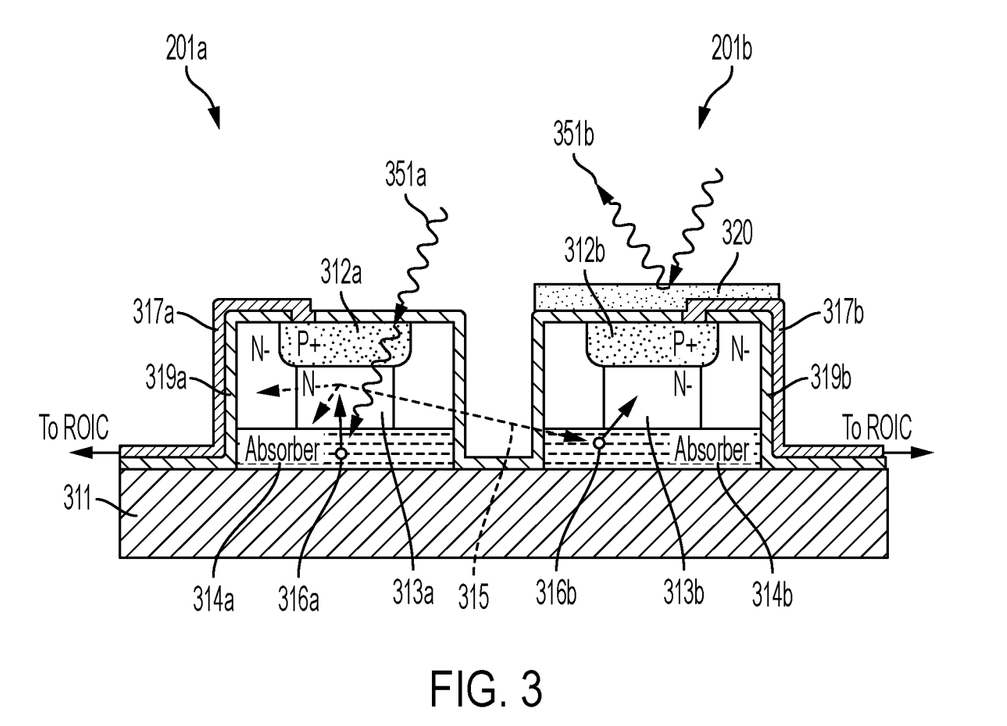
FIG. 3 illustrates an example masked pixel and an example unmasked pixel that may be employed in a detector array such as that of FIG. 2.

FIG. 3 illustrates elements of an unmasked pixel 201a and a masked pixel 201b on a substrate 311 of a detector array. A surface region of p-type semiconductor material 312a is positioned at the top of the photodetector forming a p-n junction that is held in reverse bias. In a Geiger-mode avalanche photodiode, the reverse bias is held at a value above the breakdown voltage, Vbr. The drift layer 313a located just below the p-type region 312a extends a few microns and acts as a multiplication region which amplifies excited carriers from the absorber region. The substrate 311 may be formed of an n-type semiconductor material and serve an n+ cathode for each pixel. The Geiger-mode device can also be formed with opposite polarity using a p-type substrate and drift region with an n+ region formed at the top.

Referring to unmasked pixel 201a, an incident photon 351a passes through the top of the pixel, p-region and drift layer until it reaches the absorber 314a, which is a semiconductor material with lower bandgap energy than the incident photon energy (e.g. InGaAs for near IR photons). In the absorber, the photon generates an exciton, 316a (i.e. electron-hole pair). The generated carriers are accelerated in opposite directions by the applied electric field, where one carrier 316a (in this case a hole) drifts to the multiplication region 313a. Once the carrier reaches the multiplication region, the carrier induces an electron avalanche through impact ionization and amplification occurs to create a measurable current as measured through metal trace 317a that leads from the surface region of p-type semiconductor material 312a to a readout integrated circuit (ROIC) (not shown).

For the polarity case in FIG. 3, the contact trace 317a serves as an anode for the detector and may be made of a metal or any suitable conductive material typical for semiconductor wafer processes. The entire surface of the pixel array and substrate 311 are coated with an anti-reflective dielectric coating 319a that also serves as an electrically insulating passivation layer to prevent current from leaving the detector at any point other than the point where the contact trace 317a meets the semiconductor material in the p-region 312a. The anti-reflective coating may be formed using a process such as depositing a thin oxide or nitride layer on the surface of the photodiode suitable to passivate the pixel surfaces at the applied reverse bias and prevent any significant current leakage from the anode to the cathode.

Referring to unmasked pixel 201a, a fundamental source of intrinsic noise arises due to impact ionization and avalanching process. The process also induces luminescence 315 at the higher band gap energy of the drift layer material (e.g. Eg=1.33 eV for InP for near IR regime). These higher energy photons scatter in all directions, and can propagate to the neighboring pixel's absorber layer 314b and create unwanted excitons 316b, and unwanted counts in those pixels, i.e. noise. This phenomena is a form of crosstalk and is a fundamental component of the intrinsic noise generated in Geiger-mode photodetectors, and limits how tightly the pixels can be pitched, by reducing the signal-to-noise ratio of any particular pixel as the pixels get closer and closer. Furthermore, the drift layer luminescence created by avalanche events can induce a cascading effect as the unwanted excitons 316b also create avalanches in neighboring pixels and thus more luminescence events. This cascading intrinsic noise source, if strong enough, can propagate across a whole array of tightly pitched pixels.

Similar to unmasked pixel 201a, masked pixel 201b includes a surface region of p-type semiconductor material 312b, a drift region of n-type semiconductor material 313b, an anti-reflective coating 319b and a conductive contact trace 317b that leads to a ROIC (not shown). However, the exposed surfaces of pixel 201b, including surface region 312b and a conductive contact trace 317b are coated with a mask 320 that blocks light 351b from reaching the absorber region 314b of the photodetector. The incident photons are absorbed in the mask material and reflected away. Because no light reaches the active region, the only signal that will be emitted via the conductive trace 317b of the masked pixel 201b will be that resulting from intrinsic noise including material defects and crosstalk.

Figure 4:
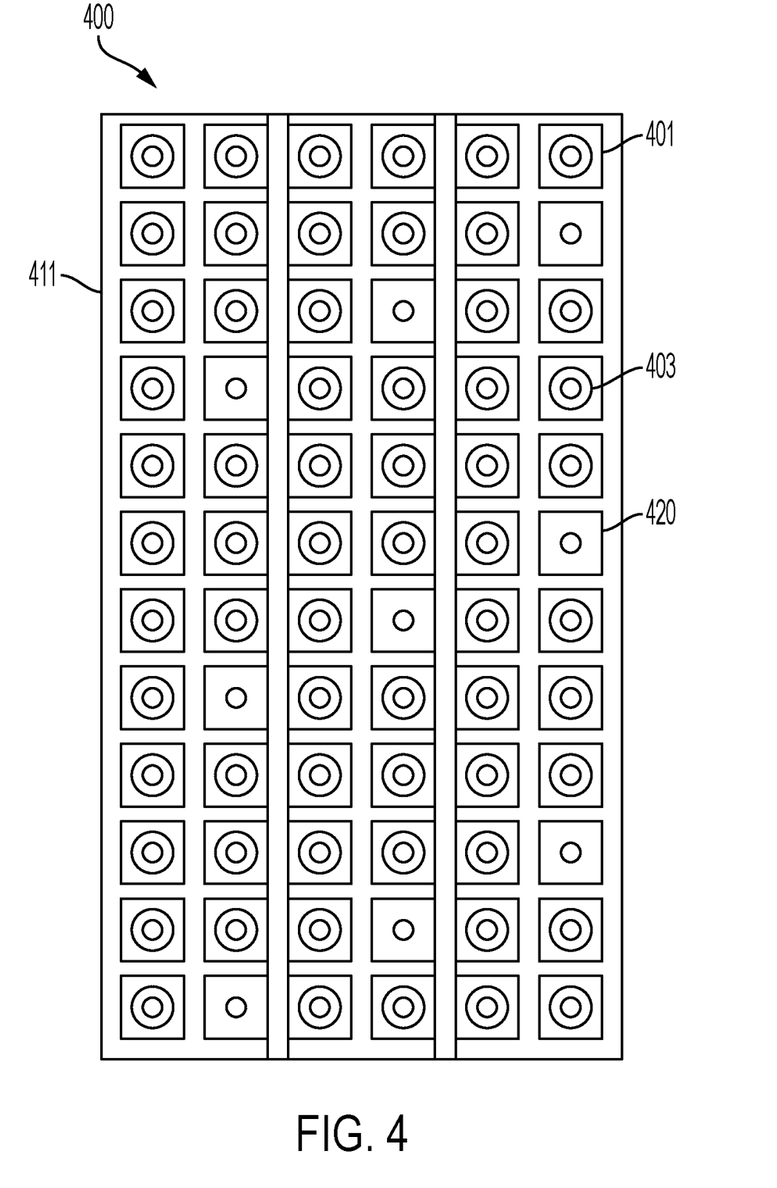
FIG. 4 is an example detector array for a LiDAR system in which light is received via a back (cathode) side of the detector array.

FIG. 4 illustrates an example back side detector array 400 that includes N×N pixels for a LiDAR system. (In this context, the "back" side is the side of the detector array 400 that includes the substrate 411 on which the photodetectors are fabricated and that serves as a cathode. In this embodiment, the cathode is positioned to face outward from the LiDAR system so that it receives the reflected light.) Each pixel 401 includes an active area that serves as a photodetector, and each pixel is connected to the cathode via a metal layer with a "window" 403 that extends to the outward facing side of the cathode to receive and detect light. As with the embodiment of FIG. 2, in the embodiment of FIG. 4 a subset of the pixels' light-receiving regions will be covered by a light-blocking mask 420 made of materials such as those described above.

Figure 5:
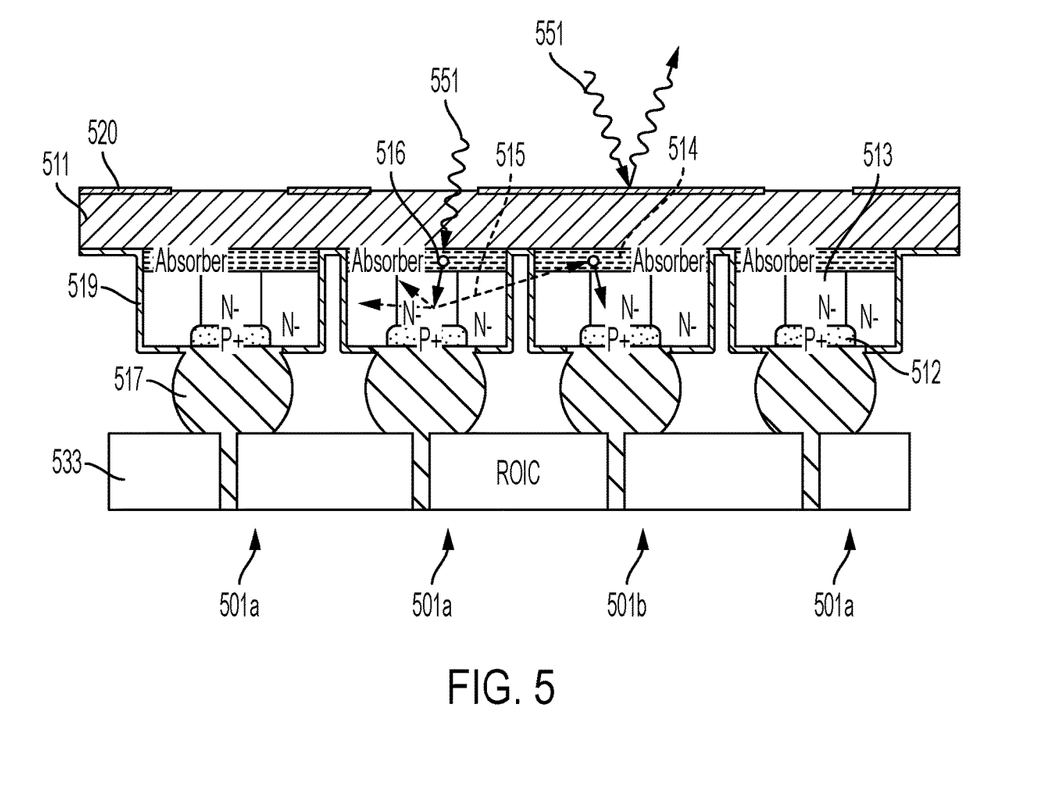
FIG. 5 illustrates an example masked pixel and an example unmasked pixel that may be employed in a detector array such as that of FIG. 4.

FIG. 5 illustrates elements of several unmasked pixels 501a and a masked pixel 501b on a substrate 511 of a back side detector array such as that shown in FIG. 4. The materials used in this embodiment may include any of those described above in the context of FIG. 3. In this variation, all pixels may have the same construction, a photodetector having a surface region of p-type semiconductor material 512 is positioned at the bottom of the photodetector to serve as an anode, and a region of n-type semiconductor material 513 is positioned between the p-type semiconductor 512 and the N+ substrate 511 to provide a p-n junction that is held under reverse bias. The current is sourced by the surface region of p-type semiconductor material 452 of the photodetector via a conductive contact trace 517 that leads from the region of p-type semiconductor material 512 to the ROIC 533. The entire photodetector and device side of the substrate 511 surface are coated with an anti-reflective dielectric coating 519 that covers all areas except where trace 517 meets makes contact to p-region 512 as described above for FIG. 3 for passivation purposes. Mask material 520 may be coated on the substrate 511 to block the light-receiving region of masked pixel 501b. Mask 520 can be the backside metal and also be the cathode. Because no light reaches the active region, the only signal that will be emitted via the conductive trace of the masked pixel 501b will be that resulting from intrinsic noise such as DCR and crosstalk as described above. As described in FIG. 3, the avalanche event induces luminescence 515 at the higher band gap energy of the drift layer material (for example, Eg=1.33 eV for indium phosphide (InP) for the near IR regime). These higher energy photons scatter in all directions, and can propagate to the neighboring pixel's absorber layer 414 and create unwanted excitons 516, and unwanted counts in those pixels, i.e. noise.

A partially masked photon counting pixel array such as those described above may be used to determine intrinsic noise in the array at any given point in time. The signal generated by unblocked (unmasked) detectors is a composite signal that is associated with multiple sources, including the reflected pulse signal, solar noise and intrinsic detector noise. The signal generated by blocked (masked) detectors should be substantially—if not entirely—the result of intrinsic noise. The spatial characteristics of this signal (i.e., where in the array the noise is located) can be used to better filter the local signal, increase the local signal-to-noise ratio and increase the detector sensitivity. The temporal characteristics of this signal (i.e., when was it detected) can be used to decouple material driven DCR and from crosstalk, since DCR typically has non-temporal statistical characteristics while crosstalk may have non-stationary temporal characteristics. The in-situ noise monitor allows for tight pitching of pixels for enhanced spatial resolution of the LiDAR system, and for addressing effects like blooming, or cascading crosstalk from intense reflections from highly reflective objects like retroreflectors used in road signs.

Figure 6:
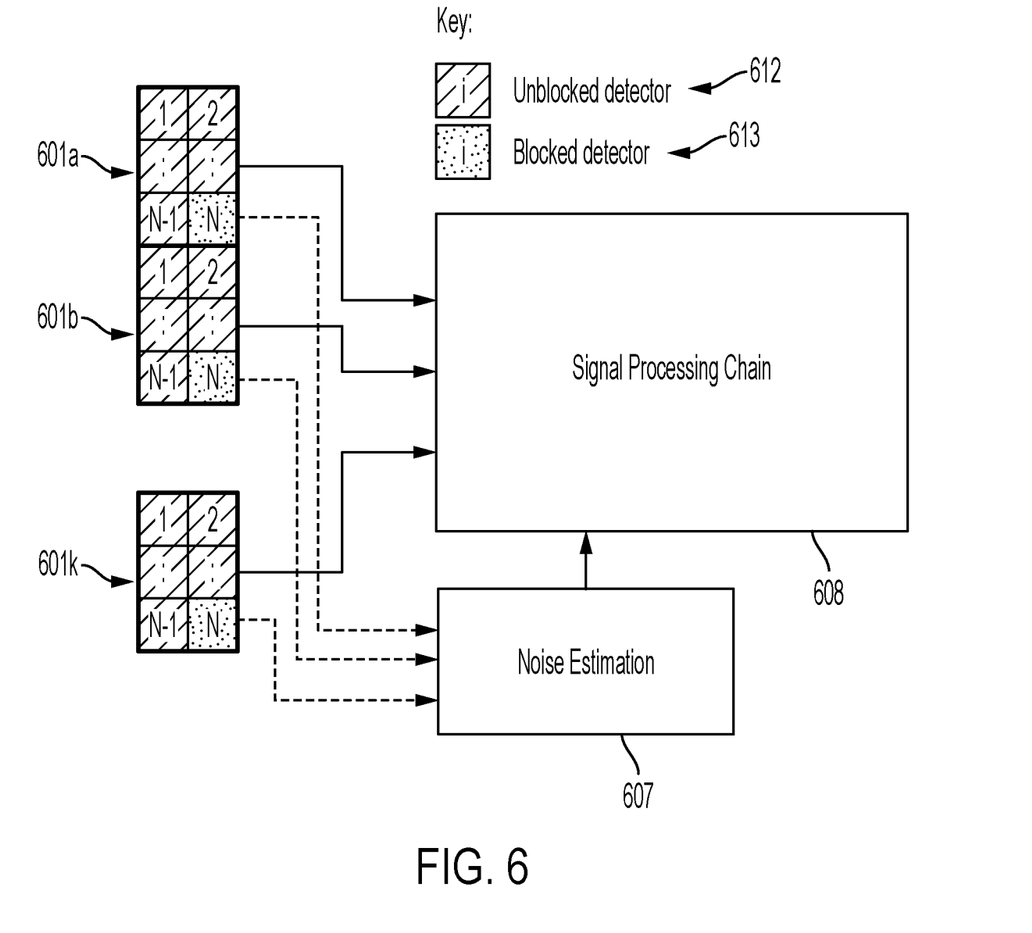
FIG. 6 is a flow diagram illustrating a process of determining intrinsic noise in a detector array.

To do this, the system may measure noise of individual pixels as shown above. Or it may identify clusters of any number of adjacent pixels (referred to in this document as "superpixels", which is an N×N array of pixels that is a subset of the overall detector array). Referring to FIG. 6, each superpixel 601a ... 601k includes a cluster of adjacent pixels that include at least one unblocked (unmasked) pixel 612 and at least one blocked (masked) pixel 613. The system may include a signal processing chain 608 that receives the output of each pixel and/or superpixel and generates the LiDAR histogram or other sensor data from the pixels' readings. This signal processing chain 608 may include hardware and programming instructions typical of that used in autonomous vehicles or other now or hereafter known LiDAR and other single photon counting detection systems. However, this system also includes a noise estimation module 607 that includes a processor, memory and programming instructions for estimating the intrinsic noise in each superpixel. The processor and memory of the noise estimation module 607 may be the same as those used in the signal processing chain 608 and/or the LiDAR system of FIG. 1, or it may contain separate hardware and/or software elements.

To determine intrinsic noise rates of a single pixel or superpixel, the system may employ a function that describes the composite signal generated by unblocked (unmasked)

$$\lambda = \sum_{i=1}^{N} \lambda_i ; \ \lambda_i = \beta \lambda_S^{(i)} + \beta \lambda_{bk}^{(i)} + \lambda_n^{(i)}$$

detectors:

in which:

$\lambda$=the avalanche count rate as received by the superpixel;

$\lambda_s^{(i)}$=the photon count rate resulting from reflected signal photons at detector i;

$\lambda_{bk}^{(i)}$=the photon count rate resulting from background signal photons (i.e., ambient light and scattered light) at detector i;

$\lambda_n^{(i)}$=the avalanche count rate of intrinsic noise of detector (i) (e.g., dark count rate (DCR) and o, crosstalk from other detectors; and β=photon detection efficiency, the probability that an incident photon will create a photocarrier and sustained avalanche.

The photon detection efficiency β is the combined efficiency due to the quantum efficiency, breakdown probability, the fill factor, and the reflective and absorptive properties of the layers above the absorber layer. The typical quantum efficiency for InGaAs devices is around 80% to 90%, whereas β is only on the order of 20-30%. The quantum efficiiency is the probability that a photon incident on the active area is converted to anexciton pair, i.e. an electron and hole pair. These photo-generated carriers, in addition to the dark current carriers, are known as primary carriers, which have potential to pass through the amplification stage and be recorded as a count. In Geiger mode, the reverse bias is a voltage above the breakdown voltage to yield a very high gain (>>1) region in the semiconductor device. A fraction of those primary carriers results in an avalanche event and a digital counter stores the arrival time of this event. This fraction is determined by the breakdown probability.

The avalanche count rate $\lambda_n^{(i)}$ resembles first-order intrinsic noise of Geiger-mode APD and does not include effects like after pulsing and early fires, which are assumed to be blocked by sufficiently long hold-off time, i.e. the time before rearming a pixel after a count has been registered.

If the equation above were applied to individual pixels, the noise estimation module 601 may identify $\lambda_n^{(i)}$ $\lambda_s^{(i)}$ and determine its effect on the total composite avalanche count rate λ.

The determination of intrinsic noise rates is not limited to the specific model above. Other models, including nonlinear models, may be employed.

Figure 7:
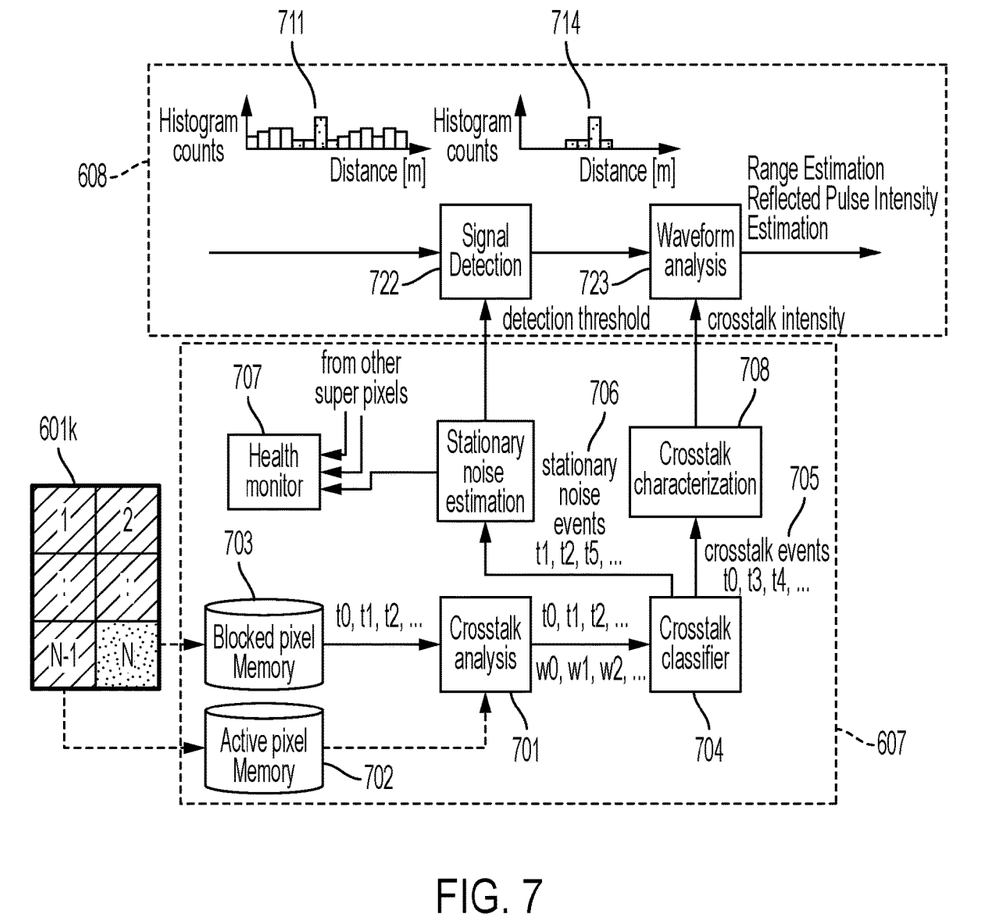
FIG. 7 further illustrates certain signal processing steps performed in the noise estimation and signal processing stages of FIG. 6.

FIG. 7 is a flow diagram that expands on the disclosure of FIG. 6 and describes in block diagram function various process steps of an example of how the blocked pixel signal can be used for noise estimation in conjunction with the remaining pixels in a superpixel. It also depicts how this information is used in a typical LiDAR signal processing chain.

At the noise estimation stage 607, one capability that is enabled by the presence of blocked pixel is the ability to characterize crosstalk in a superpixel. Crosstalk estimation is done by applying a pattern matching routine or by using cross-correlation techniques between the active pixel signal and the blocked pixel signal to obtain a score (i.e. a probability value), that a particular sample (i.e. a photon count at a particular timestamp) from any unblocked pixel is a result of a crosstalk event instead of a stationary noise (i.e. DCR). This operation is conducted by the crosstalk analysis stage 701, using active pixel data 702 and blocked pixel signal data 703 which may be retrieved from memory as shown. Then, the aggregated samples (from blocked and active pixels) are passed along with their corresponding scores to a classifier 704 which aims to divide those samples into two streams: one stream 705 is composed of the samples that are caused by crosstalk and the other one is the stream 706 of samples that are caused by uniform noise e.g., background light and dark count noise.

The samples caused by uniform noise are expected to have stationary statistical characteristics i.e., they are time invariant and can be used effectively in estimating dark count rate in this particular superpixel (by using those samples only that are obtained from blocked pixels). Aggregating this dark count rate estimate from this superpixel and other superpixels will result in a spatial profile of the dark count rate across the whole detector array which can be used by a health monitoring function 707 to gauge the health of the detector array. If the spatial variation, temporal variation, or both of that dark count rate exceeds a particular tolerance margin then the detector array is considered defective.

At signal processing level 608, FIG. 7 illustrates an application of a blocked pixel signal in a typical LiDAR signal processing chain. This chain takes a histogram 711 of the pixel samples as an input. Then, it passes the histogram into the detection stage 722, which aims to identify a particular region of the histogram 711 that is expected to have a potential object. This region is marked with grey color bars of the histogram 711. Once this part of the histogram is isolated (see 714), it is passed into a waveform analysis stage 723 which performs accurate range estimation and reflected pulse intensity estimation on that region of the histogram.

Blocked pixels enable the crosstalk and stationary noise classification, which can be leveraged in the signal processing chain as follows: The accurate noise estimation obtained by the stationary noise estimation stage 607 is fed into the detection 722 as it is used directly as a detection threshold. The crosstalk samples have temporal statistical features that can be characterized by a characterization function 708 to estimate the amount of measurement bias (amplification) in intensity estimation caused by crosstalk and compensate for this in waveform analysis stage 723.

Also, when receiving a reflected signal, the system may compare the determined intrinsic noise to the signal algorithm output to determine whether a received signal is noise only, or whether it includes a reflected signal plus noise.

When analyzing waveforms, LiDAR systems may measure the received photon counts (pulse intensity). Noise can amplify intensity measurements. By measuring the contribution of noise to signal content, the system may correct for the bias of pulse intensity estimation.

Finally, as explained above in the discussion of FIG. 7, the system may measure the health of the LiDAR detector array by monitoring the spatial variation of measured noise from blocked detectors.

The system and methods described above may be useful in various types of LiDAR systems, and can be especially useful in systems in which the density of the pixels is less than the crosstalk length. For example, referring to the example detector array 200 of FIG. 2, if the pixel pitch (that is, the distance between center points of adjacent pixels) of the array is 5 mm or less, the use of masks as described above can be of significant value of the crosstalk length is 5 mm or more.

Figure 8:
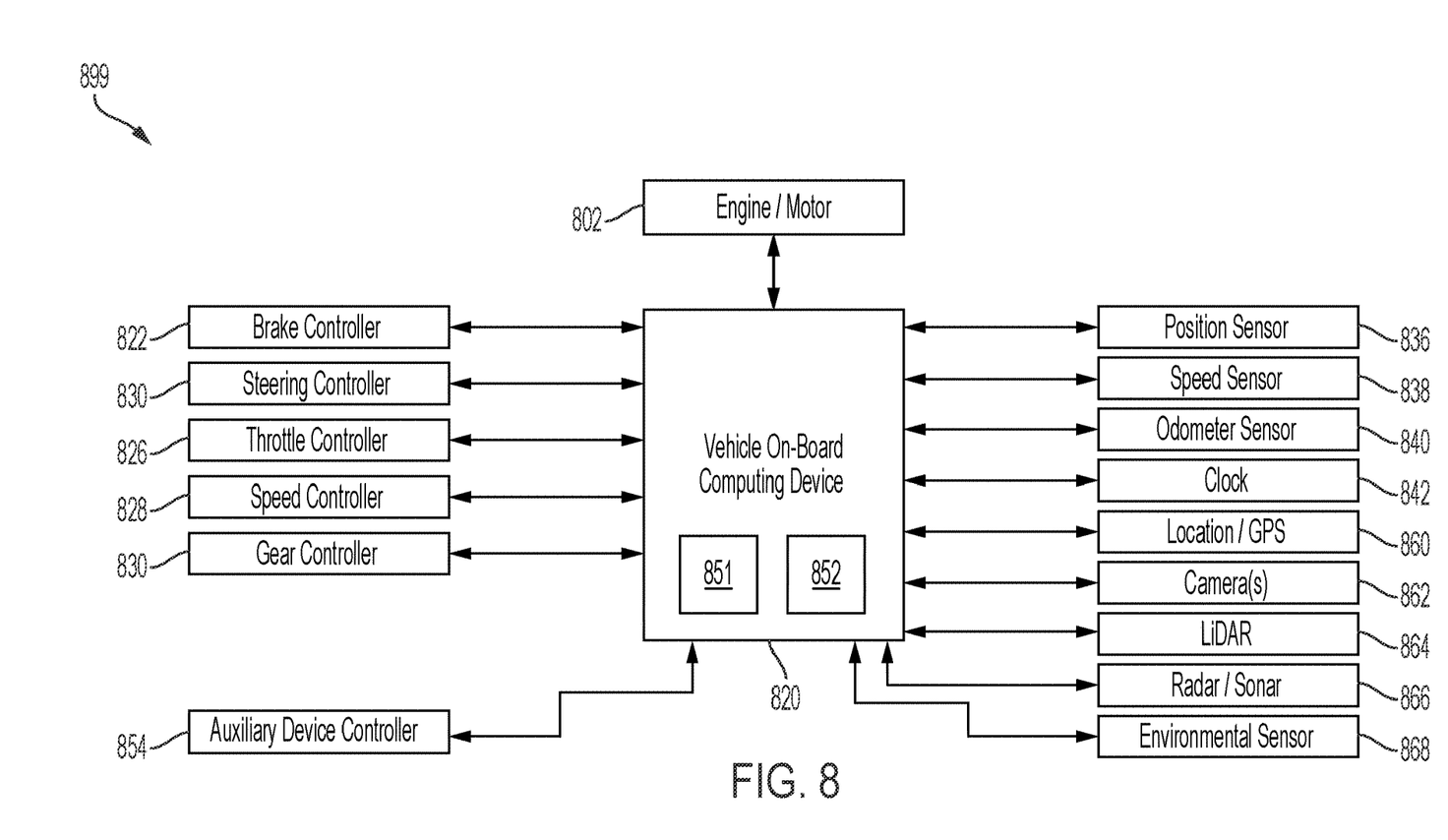
FIG. 8 is a block diagram that illustrates various elements of a possible electronic subsystem of an AV and/or external electronic device.

For example, in some embodiments the system above may be used with a LiDAR system of an autonomous vehicle. For example, FIG. 8 illustrates an example system architecture 800 for a vehicle, such as an autonomous vehicle. The vehicle includes an engine or motor 802 and various sensors for measuring various parameters of the vehicle and/or its environment. Operational parameter sensors that are common to both types of vehicles include, for example: a position sensor 836 such as an accelerometer, gyroscope and/or inertial measurement unit; a speed sensor 838; and an odometer sensor 840. The vehicle also may have a clock 842 that the system uses to determine vehicle time during operation. The clock 842 may be encoded into the vehicle on-board computing device, it may be a separate device, or multiple clocks may be available.

The vehicle also will include various sensors that operate to gather information about the environment in which the vehicle is traveling. These sensors may include, for example: a location sensor 860 such as a global positioning system (GPS) device; object detection sensors such as one or more cameras 862; a LiDAR sensor system 864; and/or a radar and or and/or a sonar system 866. The sensors also may include environmental sensors 868 such as a precipitation sensor and/or ambient temperature sensor. The object detection sensors may enable the vehicle to detect objects that are within a given distance range of the vehicle 899 in any direction, while the environmental sensors collect data about environmental conditions within the vehicle's area of travel. The system will also include one or more cameras 862 for capturing images of the environment.

During operations, information is communicated from the sensors to an on-board computing device 820. The on-board computing device 820 may include a processor 851 and a memory device 852 with programming instructions that, when executed, cause the processor 851 to analyze the data captured by the sensors and optionally control operations of the vehicle based on results of the analysis. For example, the on-board computing device 820 may control braking via a brake controller 822; direction via a steering controller 824; speed and acceleration via a throttle controller 826 (in a gas-powered vehicle) or a motor speed controller 828 (such as a current level controller in an electric vehicle); a differential gear controller 830 (in vehicles with transmissions); and/or other controllers. The on-board computing device 820 also may perform the signal processing functions and/or noise estimation functions described above in FIGS. 6 and 7. The memory device 852 of the on-board computing device 820, or another memory device in the system (such as a memory device of the LiDAR system) may provide the function of a data recorder that is configured to receive the signals from the pixels and store the characteristic data corresponding to the received signals.

Geographic location information may be communicated from the location sensor 860 to the on-board computing device 820, which may then access a map of the environment that corresponds to the location information to determine known fixed features of the environment such as streets, buildings, stop signs and/or stop/go signals. Captured images from the cameras 862 and/or object detection information captured from sensors such as a LiDAR system 864 is communicated from those sensors) to the on-board computing device 820. The object detection information and/or captured images may be processed by the on-board computing device 820 to detect objects in proximity to the vehicle 800. In addition or alternatively, the AV may transmit any of the data to an external server for processing. Any known or to be known technique for making an object detection based on sensor data and/or captured images can be used in the embodiments disclosed in this document.

In the various embodiments discussed in this document, the description may state that the vehicle or on-board computing device of the vehicle may implement programming instructions that cause the on-board computing device of the vehicle to make decisions and use the decisions to control operations of one or more vehicle systems. However, the embodiments are not limited to this arrangement, as in various embodiments the analysis, decision making and or operational control may be handled in full or in part by other computing devices that are in electronic communication with the vehicle's on-board computing device. Examples of such other computing devices include an electronic device (such as a smartphone) associated with a person who is riding in the vehicle, as well as a remote server that is in electronic communication with the vehicle via a wireless communication network. The processor of any such device may perform the operations that will be discussed below.

Terminology that is relevant to the disclosure provided above includes:

The term "vehicle" refers to any moving form of conveyance that is capable of carrying either one or more human occupants and/or cargo and is powered by any form of energy. The term "vehicle" includes, but is not limited to, cars, trucks, vans, trains, autonomous vehicles, aircraft, aerial drones and the like. An "autonomous vehicle" is a vehicle having a processor, programming instructions and drivetrain components that are controllable by the processor without requiring a human operator. An autonomous vehicle may be fully autonomous in that it does not require a human operator for most or all driving conditions and functions, or it may be semi-autonomous in that a human operator may be required in certain conditions or for certain operations, or that a human operator may override the vehicle's autonomous system and may take control of the vehicle. Autonomous vehicles also include vehicles in which autonomous systems augment human operation of the vehicle, such as vehicles with driver-assisted steering, speed control, braking, parking and other systems.

As used in this document, the term "light" means electromagnetic radiation associated with optical frequencies, e.g., ultraviolet, visible, infrared and terahertz radiation. Example emitters of light include laser emitters and other emitters that emit converged light. In this document, the term "emitter" will be used to refer to an emitter of light, such as a laser emitter that emits infrared light.

An "electronic device" or a "computing device" refers to a device that includes a processor and memory. Each device may have its own processor and/or memory, or the processor and/or memory may be shared with other devices as in a virtual machine or container arrangement. The memory will contain or receive programming instructions that, when executed by the processor, cause the electronic device to perform one or more operations according to the programming instructions.

The terms "memory," "memory device," "data store," "data storage facility" and the like each refer to a non-transitory device on which computer-readable data, programming instructions or both are stored. Except where specifically stated otherwise, the terms "memory," "memory device," "data store," "data storage facility" and the like are intended to include single device embodiments, embodiments in which multiple memory devices together or collectively store a set of data or instructions, as well as individual sectors within such devices.

The terms "processor" and "processing device" refer to a hardware component of an electronic device that is configured to execute programming instructions, such as a microprocessor or other logical circuit, A processor and memory may be elements of a microcontroller, custom configurable integrated circuit, programmable system-on-a-chip, or other electronic device that can be programmed to perform various functions. Except where specifically stated otherwise, the singular term "processor" or "processing device" is intended to include both single-processing device embodiments and embodiments in which multiple processing devices together or collectively perform a process.

This document may use the terms "photodetector" and "photosensor" interchangeably. No difference in meaning is intended between the two terms.

The above-disclosed features and functions, as well as alternatives, may be combined into many other different systems or applications. Various components may be implemented in hardware or software or embedded software. Various presently unforeseen or unanticipated alternatives, modifications, variations or improvements may be made by those skilled in the art, each of which is also intended to be encompassed by the disclosed embodiments.

The invention claimed is:

1. A system including a single photon counting sensor array comprising:
   a detector array comprising a plurality of pixels, wherein each pixel comprises one or more detectors, a plurality of which are configured to receive pulses of energy; and
   a mask material that is positioned to cover some but not all of the detectors of the plurality of pixels to yield blocked pixels and unblocked pixels so that each blocked pixel is prevented from detecting the pulses of energy,
   wherein:
   each detector comprises a photosensor that comprise a surface region of p-type semiconductor material that is positioned to receive light, and
   each blocked pixel has the mask material positioned over its surface region to block light from entering the blocked pixel through the surface region.

2. The system of claim 1, further comprising;
   a processor; and
   a memory containing programming instructions that are configured to instruct the processor to:
   receive characteristic data of signals received by the blocked pixels and the unblocked pixels, and
   compare the characteristic data of the signals received by the blocked pixels with the characteristic data of the signals received by the unblocked pixels to determine a measurement of intrinsic noise in the detector array.

3. The system of claim 1, wherein the single photon counting sensor array is an element of a light detection and ranging (LiDAR) system in systems in which a distance between center points of adjacent pixels in the detector array is less than a crosstalk length.

4. The system of claim 1, wherein each detector comprises a photosensor that further comprises:
   a conductive trace that is connected to the surface region and positioned to serve as an anode for the photosensor,
   wherein the detector array comprises a substrate on which the photosensors are positioned, wherein the substrate is configured to function as a cathode for each of the photosensors, and
   wherein a width of the mask material of each blocked pixel is greater than a width of the surface region of each blocked pixel.

5. The system of claim 4, wherein:
   the detector array comprises a substrate that is configured to function as a cathode for each of the photosensors;
   each of the photosensors comprises:
      a metal window that extends through the substrate and is configured to receives light into the photosensor,
      a region of n-type semiconductor material that is connected to the metal window,
      a region of p-type semiconductor material that is connected to the region of n-type semiconductor material, and
      a conductive trace that is connected to the region of p-type semiconductor material and positioned to serve as an anode for the photosensor; and
   the mask material is positioned to cover the metal window of each blocked pixel.

6. The system of claim 2, wherein the programming instructions that are configured to instruct the processor to compare the characteristic data of the signals received by the blocked pixels with the characteristic data of the signals received by the unblocked pixels to determine a measurement of intrinsic noise in the detector array comprise instructions to:
   identify a superpixel comprising a group of the pixels in the detector array;
   determine a total photon count rate received by the superpixel;
   determine an avalanche count rate received by the unblocked pixels of the superpixel; and
   determine the measurement of noise as a function of the total photon count rate and the avalanche count rate received by the unblocked pixels of the superpixel.

7. The system of claim 6, wherein the detector array is a back side detector array of a light detection and ranging (LiDAR) system.

8. The system of claim 1, further comprising a data recorder that is configured to receive the signals from the pixels and store the characteristic data corresponding to the received signals.

9. The system of claim 1, wherein the mask material comprises metal.

10. The system of claim 2, further comprising additional programming instructions that are configured to instruct the processor to measure health of the detector array by monitoring spatial variation, temporal variation, or both spatial and temporal variation of measured noise from blocked detectors.

11. The system of claim 2, further comprising additional programming instructions that are configured to instruct the processor to apply a characterization function to estimate, in an intensity estimation, an amount of measurement bias caused by crosstalk.

12. A method of operating a single photon counting sensor array, the method comprising:
   operating a light detection and ranging (LiDAR) system that comprises:
      a detector array comprising a plurality of pixels, wherein each pixel comprises one or more detectors, a plurality of which are configured to receive pulses of energy, and
      a mask material that is positioned to cover some but not all of the detectors of the plurality of pixels to yield blocked pixels and unblocked pixels so that each blocked pixel is prevented from detecting the pulses of energy; and
   by a processor:
      receiving characteristic data of signals received by the blocked pixels and the unblocked pixels, and
      comparing the characteristic data of the signals received by the blocked pixels with the characteristic data of the signals received by the unblocked pixels to determine a measurement of intrinsic noise in the detector array,
   wherein:
   each detector comprises a photosensor that comprises:
      a surface region of p-type semiconductor material that is positioned to receive light; and
      a drift region of n-type semiconductor material, and each blocked pixel has the mask material positioned over its surface region to block light from entering the blocked pixel through the surface region.

13. The method of claim 12, wherein:
each detector comprises a photosensor that further comprises:
   a conductive trace that is connected to the surface region and positioned to serve as an anode for the photosensor;
the detector array comprises a substrate on which the photosensors are positioned,
the substrate is configured to function as a cathode for each of the photosensors, and
a width of the mask material of each blocked pixel is greater than a width of the surface region of each blocked pixel.

14. The method of claim 13, wherein:
the detector array comprises a substrate that is configured to function as a cathode for each of the photosensors;
each of the photosensors comprises:
   a metal window that extends through the substrate and is configured to receives light into the photosensor;
   a region of n-type semiconductor material that is connected to the metal window;
   a region of p-type semiconductor material that is connected to the region of n-type semiconductor material; and
   a conductive trace that is connected to the region of p-type semiconductor material and positioned to serve as an anode for the photosensor; and
the mask material is positioned to cover the metal window of each blocked pixel.

15. The method of claim 12, wherein comparing the characteristic data of the signals received by the blocked pixels with the characteristic data of the signals received by the unblocked pixels to determine a measurement of intrinsic noise in the detector array comprises:
   identifying a superpixel comprising a group of the pixels in the detector array;
   determining a total photon count rate received by the superpixel;
   determining an avalanche count rate received by the unblocked pixels of the superpixel; and
   determining the measurement of noise as a function of the total photon count rate and the avalanche count rate received by the unblocked pixels of the superpixel.

16. The method of claim 15, wherein the function is:

$$\lambda = \sum_{i=1}^{N} \lambda_i : \lambda_i = \beta \lambda_S^{(i)} + \beta \lambda_{bk}^{(i)} + \lambda_n^{(i)}$$

in which:
   $\lambda$=avalanche count rate as received by of the superpixel;
   $\lambda_S^{(i)}$=a photon count rate resulting from reflected signal photons at photosensor i;
   $\lambda_{bk}^{(i)}$=a photon count rate resulting from background signal photons (i.e., at detector i;
   $\lambda_n^{(i)}$=avalanche count rate of intrinsic noise of detector i; and
   $\beta$=photon detection efficiency.

17. The method of claim 12 further comprising, by a data recorder:
   receiving the signals from the pixels; and
   storing the characteristic data corresponding to the received signals.

18. The method of claim 12 further comprising, by the processor, measuring health of the detector array by monitoring spatial variation, temporal variation, or both spatial and temporal variation of measured noise from blocked detectors.

19. The method of claim 12 further comprising, by the processor, applying a characterization function to estimate, in an intensity estimation, an amount of measurement bias caused by crosstalk.

20. A non-transitory computer program product comprising a memory storing programming instructions that, when executed, will cause one or more processors to:
   in a light detection and ranging (LiDAR) system that comprises:
      a detector array comprising a plurality of pixels, wherein each pixel comprises one or more detectors, a plurality of which are configured to receive pulses of energy, and
      a mask material that is positioned to cover some but not all of the detectors of the plurality of pixels to yield blocked pixels and unblocked pixels so that each blocked pixel is prevented from detecting the pulses of energy;
   receive characteristic data of signals received by the blocked pixels and the unblocked pixels; and
   compare the characteristic data of the signals received by the blocked pixels with the characteristic data of the signals received by the unblocked pixels to determine a measurement of intrinsic noise in the detector array,
wherein:
   each detector comprises a photosensor that comprises:
      a surface region of p-type semiconductor material that is positioned to receive light;
      a drift region of n-type semiconductor material;
      a conductive trace that is connected to the surface region and positioned to serve as an anode for the photosensor; and
      an absorber comprised of a semiconductor material and configured to have a lower bandgap energy than the incident photon energy to generate an exciton to create a current that is measured through the conductive trace,
   the detector array comprises a substrate on which the photosensors are positioned,
   the substrate is configured to function as a cathode for each of the photosensors,
   each blocked pixel has the mask material positioned over its surface region to block light from entering the blocked pixel through the surface region, and
   a width of the mask material of each blocked pixel is greater than a width of the surface region of each blocked pixel.

\* \* \* \* \*